(12) United States Patent
Watatani et al.

(10) Patent No.: US 7,298,769 B2
(45) Date of Patent: Nov. 20, 2007

(54) SEMICONDUCTOR LASER

(75) Inventors: Chikara Watatani, Tokyo (JP);
Masayoshi Takemi, Tokyo (JP);
Yuichiro Okunuki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 30 days.

(21) Appl. No.: 11/410,057

(22) Filed: Apr. 25, 2006

(65) Prior Publication Data
US 2006/0268952 A1 Nov. 30, 2006

(30) Foreign Application Priority Data
May 30, 2005 (JP) ............... 2005-156620

(51) Int. Cl.
*H01S 5/00* (2006.01)
(52) U.S. Cl. ............... 372/43.01; 372/45.01; 372/46.01
(58) Field of Classification Search ............. 372/43.01, 372/46.01, 45.01
See application file for complete search history.

(56) References Cited

U.S. PATENT DOCUMENTS

| | | | | |
|---|---|---|---|---|
| 5,319,657 A | | 6/1994 | Otsuka et al. | |
| 5,404,028 A | * | 4/1995 | Metzger et al. | 257/15 |
| 5,561,681 A | * | 10/1996 | Nishimura | 372/46.01 |
| 5,585,309 A | * | 12/1996 | Mori et al. | 438/43 |
| 5,661,741 A | * | 8/1997 | Kakimoto | 372/50.22 |
| 5,792,674 A | * | 8/1998 | Kitamura | 438/31 |
| 5,814,534 A | * | 9/1998 | Kimura et al. | 438/46 |
| 5,956,360 A | * | 9/1999 | Bylsma et al. | 372/45.01 |
| 6,323,507 B1 | * | 11/2001 | Yokoyama et al. | 257/79 |
| 6,664,605 B1 | * | 12/2003 | Akulova et al. | 257/432 |
| 2003/0071265 A1 | * | 4/2003 | Thompson et al. | 257/79 |

FOREIGN PATENT DOCUMENTS

| | | |
|---|---|---|
| JP | 05-198894 | 8/1993 |
| JP | 2001-053385 | 2/2001 |

* cited by examiner

*Primary Examiner*—Minsun Oh Harvey
*Assistant Examiner*—Philip Nguyen
(74) *Attorney, Agent, or Firm*—Leydig, Voit & Mayer, Ltd.

(57) ABSTRACT

A p-type InP buffer layer containing Zn in a low concentration and an undoped InP buffer layer having a carrier concentration of $3\times10^{17}$ cm$^{-3}$ or less are stacked on a p-type InP substrate containing Zn. On the undoped InP buffer layer, a Mg-doped p-type InP cladding layer, an InGaAsP optical confinement layer, an InGaAsP MQW active layer, an n-type InGaAsP optical confinement layer, and an n-type InP cladding layer are successively stacked. The diffusion of Zn from the p-type InP substrate into the InGaAsP MQW active layer is suppressed. Moreover, a steep doping profile can be formed in the vicinity of the active layer so that deterioration of device characteristics is suppressed.

11 Claims, 5 Drawing Sheets

SEMICONDUCTOR LASER

BACKGROUND OF THE INVENTION

1. Field of the Invention

The present invention relates to a semiconductor laser and, more particularly, to a structure of a semiconductor laser using a p-type InP substrate.

2. Background Art

Semiconductor materials from such systems as an InGaAsP system and an AlGaInAs system are used for a material of a semiconductor laser for use in communication with a 1.3 μm band and a 1.55 μm band. These materials have bandgap energies corresponding to the above-mentioned wavelength range and can be lattice-matched to the InP of the substrate. Moreover, as a substrate of the above-mentioned semiconductor laser, a p-type substrate is in wide use. This is because an NPN type bipolar transistor operable at a high speed can be used as a driving circuit.

FIG. 7 is a cross-sectional view illustrating a conventional InGaAsP system semiconductor laser element formed by employing a p-type substrate.

This semiconductor laser is produced by using a p-type substrate 1 containing Zn. A Zn-doped p-type InP clad layer 4, an InGaAsP optical confinement layer 5, an InGaAsP MQW (Multiple Quantum Well) 6, an n-type InGaAsP optical confinement layer 7, and an n-type InP clad layer 8 are successively stacked on the p-type substrate 1 to be formed in a film. This stacked film has slopes on both sides thereof. A p-type InP buried layer 10, an n-type InP current blocking layer 11, and a p-type current blocking layer 12 are provided outside these slopes. Moreover, an n-type InP contact layer 13 is formed on the n-type InP clad layer 8 and the p-type current blocking layer 12 so as to cover the entire area of both layers (for example, it should be referred to Japanese Unexamined Patent Publication No. 2001-53385).

SUMMARY OF THE INVENTION

Zn has been widely used as a p-type dopant in the aforementioned conventional semiconductor laser. Since the diffusion coefficient of Zn in InP is large, Zn contained in the p-type InP substrate 1 and in the Zn-doped p-type InP clad layer 4 is apt to diffuse into the InGaAsP MQW (Multiple Quantum Well) active layer 6. Zn that was diffused into the aforementioned active layer becomes a non-radiative center which causes a reduction in the efficiency, resulting in deteriorating the device characteristics. In order to suppress this defect, a method has been employed in which the Zn concentration profile was controlled by decreasing the carrier concentration in the vicinity of the active layer of the Zn-doped p-type InP clad layer 4. However, this method must depend on the diffusion of Zn, so that it was rather difficult to obtain a steep doping profile in the vicinity of the aforementioned active layer.

The present invention was made to overcome the aforementioned defects and thus, an objective of the present invention is to control the diffusion of dopants into an active layer of a semiconductor laser employing a p-type InP substrate thereby improving the aforementioned semiconductor laser characteristics.

According to the present invention, diffusion of dopants into an active layer is controlled, so that the characteristics of a semiconductor laser can be improved.

BEST MODE FOR CARRYING OUT THE INVENTION

Figure 1:
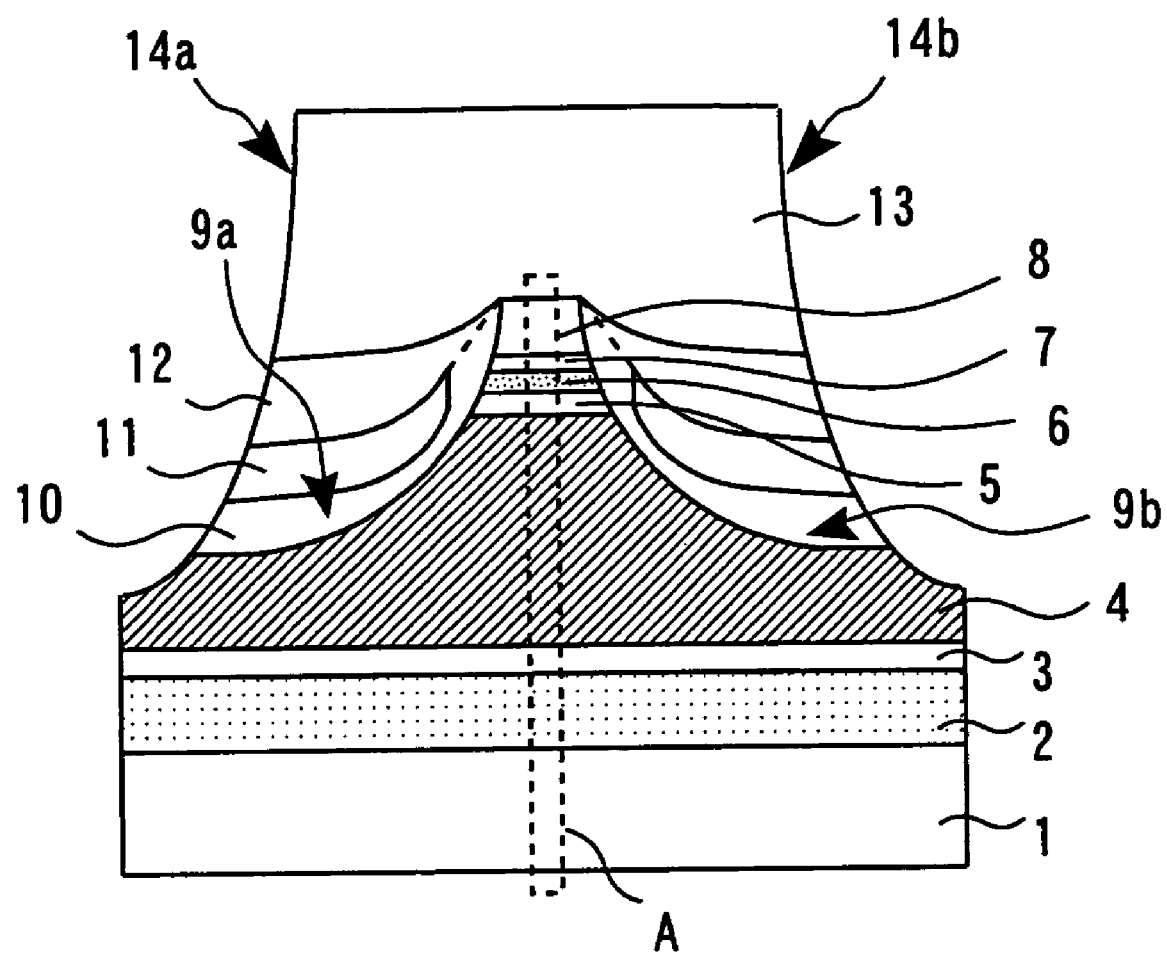
FIG. 1 is a cross-sectional view illustrating a semiconductor laser of the first embodiment.

Descriptions of the preferred embodiments of the present invention will be provided hereinbelow, with reference to the accompanying drawings. In each of the drawings, identical or corresponding parts or elements will be designated by the same reference characters to simplify or omit the description thereof.

First Embodiment

FIG. 1 is a cross-sectional view illustrating a semiconductor laser of the present embodiment.

This semiconductor laser is produced by employing a Zn-doped p-type InP substrate 1 in which Zn (zinc) is doped into an InP (indium phosphorus) substrate. A Zn-doped p-type InP buffer layer 2 is provided on the Zn-doped p-type InP substrate 1, and on that layer, is stacked an undoped InP buffer layer 3 in which the carrier density is controlled to be $3 \times 10^{17}$ cm$^{-3}$ or less. A Mg-doped p-type InP clad layer 4 in which Mg (magnesium) is doped as a p-type dopant into the InP is stacked on the layer 3. This layer 4 is electrically connected to the Zn-doped p-type InP substrate 1 through the Zn-doped p-type InP buffer layer 2 and the undoped InP buffer layer 3.

An InGaAsP optical confinement layer 5, an InGaAsP MQW (Multiple Quantum Well) active layer 6, an n-type InGaAsP optical confinement layer 7, and an n-type InP clad layer 8 are stacked one after the other on the Mg-doped p-type InP clad layer 4. While electrically energizing this semiconductor laser, holes are injected into the InGaAsP MQW active layer 6 from the side of the Mg-doped p-type InP clad layer 4 and electrons are injected into the InGaAsP MQW active layer 6 from the side of the n-type InP clad layer 8. A laser beam is emitted from the InGaAsP MQW active layer 6 by coupling these holes and electrons.

The stacked film constituted by the Mg-doped p-type InP clad layer 4, the InGaAsP optical confinement layer 5, the InGaAsP MQW active layer 6, the n-type InGaAsP optical confinement layer 7, and the n-type InP clad layer 8 has slopes on both sides (hereinafter, they are referred to as mesa 9a and mesa 9b, respectively). Mesas 9a and 9b have a skirt-shaped form in which the width of each mesa becomes wider as it approaches a position in vicinity of the Zn-doped p-type InP substrate 1. A p-type InP buried layer 10, an n-type InP current blocking layer 11, and a p-type current blocking layer 12 are successively stacked to have predetermined widths outside the mesas 9a and 9b. The Mg-doped p-type InP clad layer 4 is exposed at the bottom of the mesas 9a and 9b. Zn is doped as a p-type dopant in the p-type InP buried layer 10 and the p-type current blocking layer 12.

An n-type InP contact layer 13 is formed on the entire surface of the n-type InP clad layer 8 and the p-type current blocking layer 12. Isolation grooves 14a and 14b are formed outside the p-type InP buried layer 10, the n-type InP current blocking layer 11, the p-type current blocking layer 12, and the n-type InP contact layer 13. The p-type InP buried layer 10, the n-type InP current blocking layer 11, the p-type current blocking layer 12, and the n-type InP contact layer 13 are exposed at the sidewalls of the isolation grooves 14a and 14b. The Mg-doped p-type InP clad layer 4 is exposed at the bottom of the isolation grooves 14a and 14b.

In this semiconductor laser, while being electrically energized, a positive voltage is applied to the side of the Zn-doped p-type InP substrate 1 and a negative voltage is applied to the side of the n-type InP contact layer 13, and then, current flows.

In the semiconductor laser shown in FIG. 1, the Zn-doped p-type InP buffer layer 2 is provided on the Zn-doped p-type InP substrate 1. This layer 2 is one in which the Zn concentration is made lower than the Zn-doped p-type InP substrate 1. As a result, the amount of Zn existing in the interstitial sites of this layer is smaller than the Zn-doped p-type InP substrate 1.

Herein, a lot of inactive Zn is contained in interstitial sites of the Zn-doped p-type InP substrate 1. This Zn easily diffuses toward the undoped InP buffer layer 3. However, an employment of the aforementioned structure allows the distance over which this Zn reaches the undoped InP buffer layer 3 to be longer. Therefore, the amount of the dopant (Zn) which diffuses from the Zn-doped p-type InP substrate 1 and reaches the undoped InP buffer layer 3 can be suppressed to a small amount.

Moreover, in the above-mentioned semiconductor laser, the Mg-doped p-type InP clad layer 4 is stacked on the undoped InP buffer layer 3. This layer is one in which Mg is doped in InP as a p-type dopant. Namely, although Zn has been conventionally used as a p-type dopant, Mg is now used in Zn's stead. Herein, the Mg concentration is controlled to be approximately $5 \times 10^{17}$ to $2 \times 10^{18}$ cm$^{-3}$.

It is to be noted that the diffusion coefficient of Mg in InP is smaller than that of Zn. Therefore, in the above-mentioned semiconductor laser, diffusion of dopant to the InGaAsP MQW active layer 6 can be suppressed compared with the conventional semiconductor laser.

Moreover, the undoped InP buffer layer 3 is provided between the Zn-doped p-type InP buffer layer 2 and the Mg-doped p-type InP clad layer 4 in the above-mentioned semiconductor laser. No dopant is doped in the layer 3.

Herein, in the case when a film containing therein Zn and another film containing therein Mg come into contact with each other, it is well known that these elements diffuse in such a way as to mutually exchange each other (hereinafter, it will be referred to as interdiffusion). However, an application of the aforementioned structure enables it to use the undoped InP buffer layer 3 as a barrier for the above-mentioned interdiffusion. Therefore, the interdiffusion between the Zn-doped p-type InP buffer layer 2 and the Mg-doped p-type clad layer 4 can be suppressed. The thickness of each of the Zn-doped p-type InP buffer layer 2 and the undoped InP buffer layer 3 is controlled so that the interdiffusion is prevented from occurring during crystal growth after forming these layers and in the subsequent heat treatment process.

Figure 7:
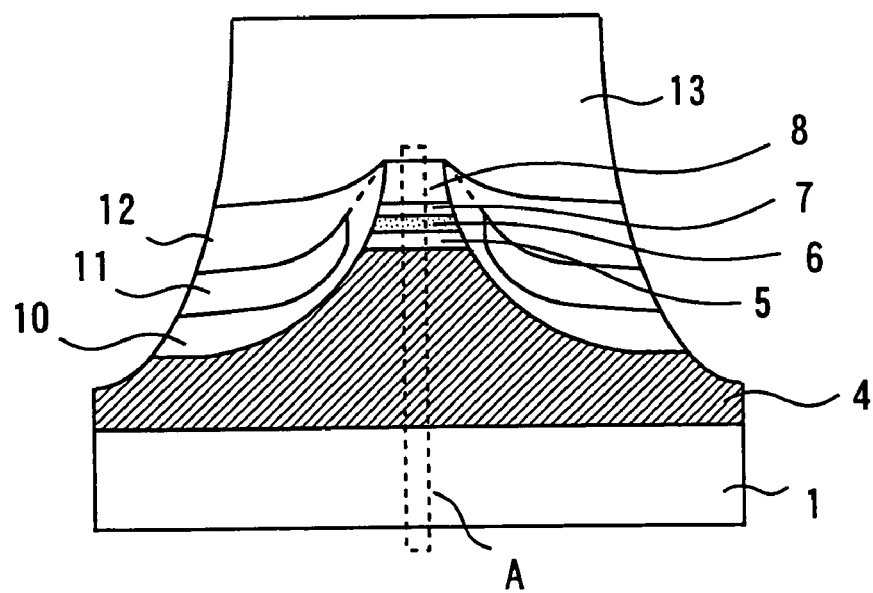
FIG. 7 is a cross-sectional view illustrating a conventional semiconductor laser.

In the aforementioned semiconductor laser, the undoped InP buffer layer 3 is one that does not contain dopants, so that it has a specific resistance larger than the Mg-doped p-type InP clad layer 4. Therefore, the resistance in the current path from the Mg-doped p-type InP clad layer 4 to the Zn-doped p-type InP substrate 1 increases compared with that of the structure according to the prior art as shown in FIG. 7. Here, it is to be noted that the undoped InP buffer layer 3 is arranged so as to be located under the bottom faces of the mesas 9a and 9b and the bottom faces of the isolation grooves 14a and 14b. Accordingly, the width of the undoped InP buffer layer 3 in the above-mentioned current path is assumed to be larger than that of the Mg-doped p-type InP clad layer 4. Therefore, an increase in the resistance in the current path can be suppressed to a small level.

In the described semiconductor laser, Mg is used as a dopant. The amount of diffusion of Mg into the active layer in this case will be described below.

Figure 2A:
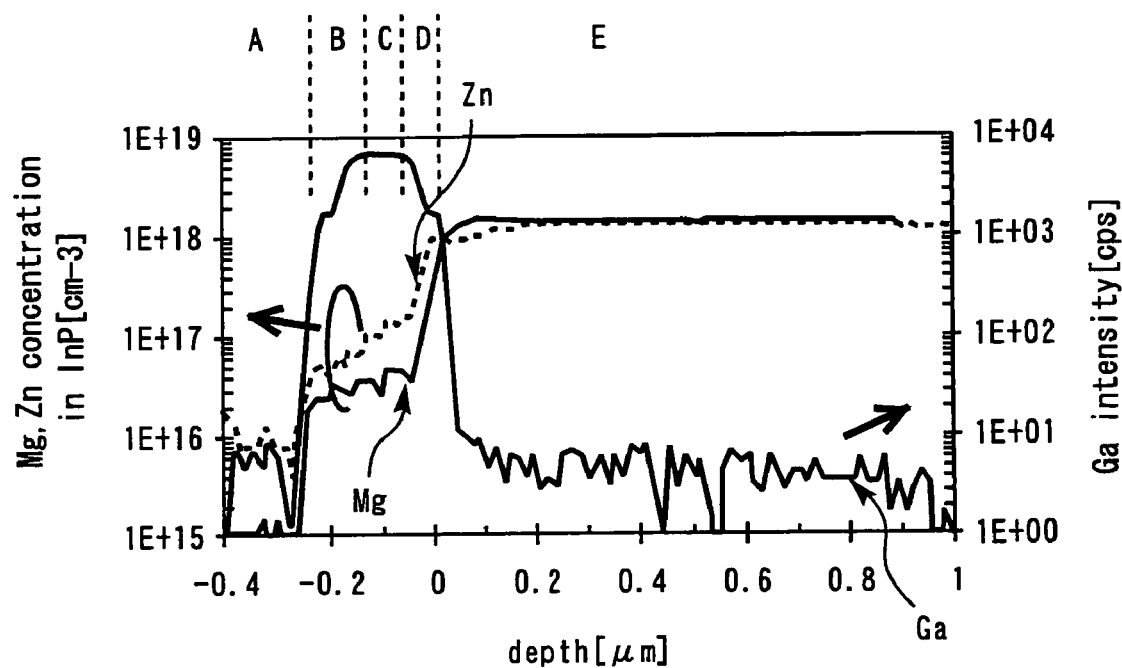
FIGS. 2A-2C are results of the Mg concentration of the semiconductor laser of the first embodiment and the Zn concentration of a conventional semiconductor laser.
Figure 2B:
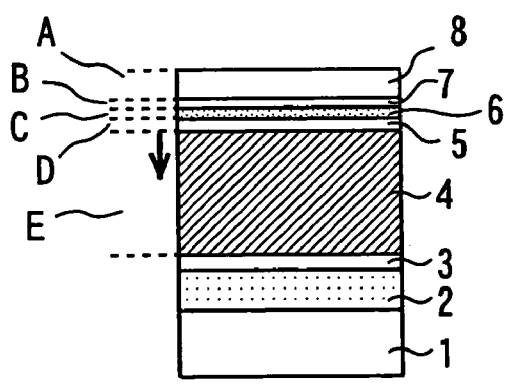
Figure 2C:
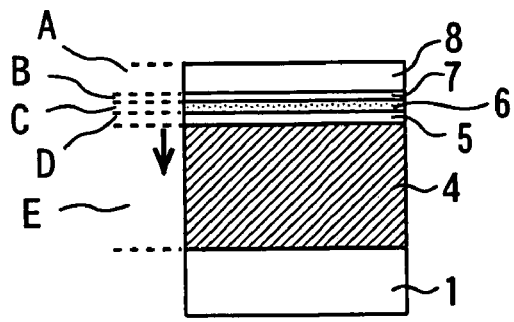

FIG. 2A illustrates the measurement results of the Mg concentration of the semiconductor laser (FIG. 1) of the present embodiment and the Zn concentration of a conventional semiconductor laser (FIG. 7) using the Secondary Ion Mass Spectroscopy (hereinafter, it will be referred to as called "SIMS"). The film-configuration of the semiconductor laser used in this measurement is shown in FIGS. 2B and 2C. FIG. 2B is an enlargement of the dotted line part A in FIG. 1, and FIG. 2C is an enlarged view of the dotted line part A in FIG. 7.

FIG. 2A is graphical view in which the Mg and Zn concentrations are plotted where the abscissa indicates the depth of the InGaAsP optical confinement layer 5 of FIGS. 2B and 2C with the bottom part of this layer set to be the point of origin (the direction of an arrow in FIG. 2B or 2C being toward the plus side). These concentrations are shown on the left side ordinate. Moreover, in FIG. 2A, the measured intensity of Ga (gallium) contained in the aforementioned semiconductor laser is also plotted. This measured intensity is indicated on the right side ordinate. The distribution of the measured intensity corresponds to the position of the film shown in FIGS. 2B and 2C. That is to say, the positions of regions A through E in FIGS. 2B and 2C correspond to the regions A through E in FIG. 2A, respectively.

As shown in FIG. 2A, the profile of Mg concentration is steeper than the profile of Zn concentration in the vicinity of the interface of the region D and the region E. This indicates that a steep doping profile is formed in the vicinity of the active layer of the Mg-doped p-type InP clad layer 4 by using Mg as a p-type dopant. Moreover, at the region C, the Mg concentration becomes smaller than the Zn concentration. This indicates that the amount of dopant diffusing into the active layer is decreased by using Mg as a p-type dopant.

As a result, it was confirmed that a steep doping profile could be formed in the vicinity of the active layer of the clad layer and that the diffusion of dopants into the active layer could be suppressed by using Mg as a p-type dopant. Therefore, deterioration of device characteristics can be suppressed and the semiconductor laser characteristics can be improved.

Next, a description of the manufacturing method of a semiconductor laser as shown in FIG. 1 will be provided hereinbelow.

Figure 3A:
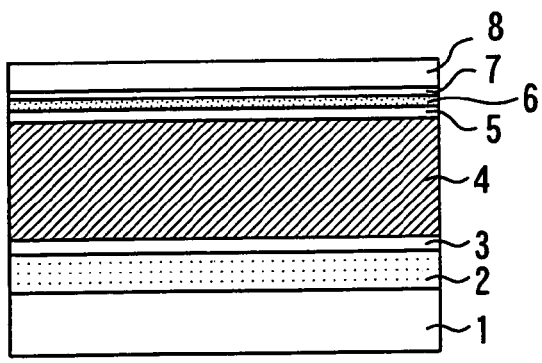
FIGS. 3A-3F are cross-sectional views of the manufacturing method of a semiconductor laser of the first embodiment.

First of all, as shown in FIG. 3A, the Zn-doped p-type InP buffer layer 2, the undoped InP buffer layer 3, the Mg-doped p-type InP clad layer 4, the InGaAsP optical confinement layer 5, the InGaAsP MQW active layer 6, the n-type InGaAsP optical confinement layer 7, and the n-type InP clad layer 8 are successively stacked on the Zn-doped p-type InP substrate 1. These respective layers are formed by using, for instance, a Metal Organic Vapor Phase Epitaxy (hereinafter, it will be referred to as MOVPE) technique.

Figure 3D:
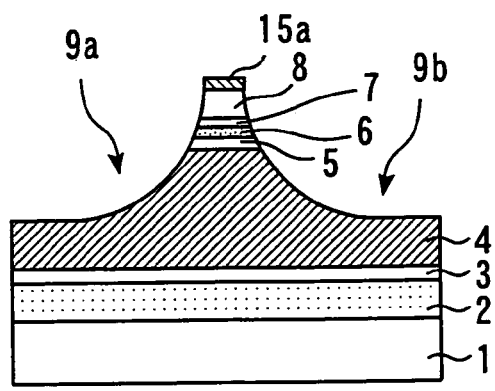
Figure 3B:
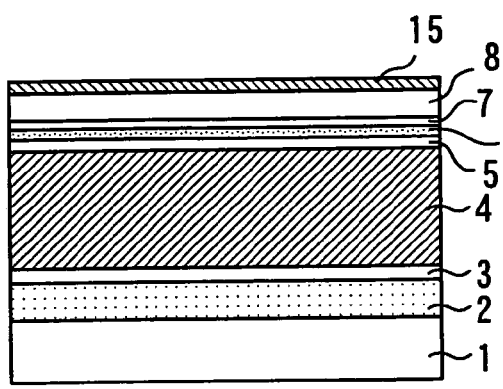

Next, as shown in FIG. 3B, a silicon oxide film 15 is formed on the n-type InP clad layer 8. Then, a resist pattern (not shown in the figure) is formed on the n-type InP clad layer 8. By using this as a mask, photolithography is performed to form a mask 15a as shown in FIG. 3C. Subsequently, wet etching is carried out using the mask 15a as a mask. As a result, as shown in FIG. 3D, the mesas 9a and 9b are formed at the side walls of the Mg-doped p-type InP clad layer 4, the InGaAsP optical confinement layer 5, the InGaAsP MQW active layer 6, the n-type InGaAsP optical confinement layer 7, and the n-type InP clad layer 8.

Figure 3E:
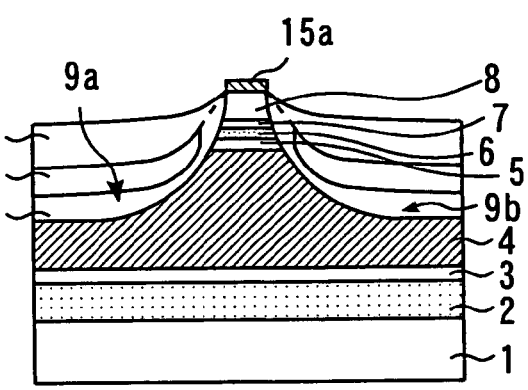
Figure 3C:
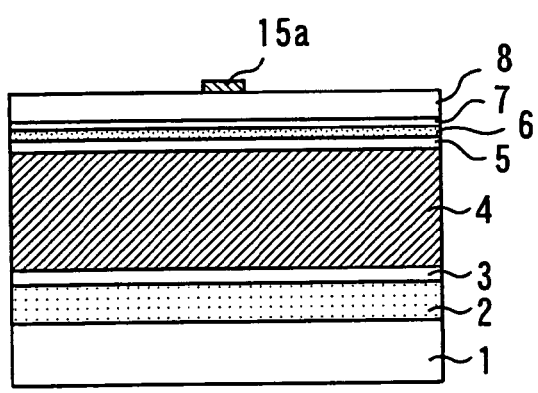
Figure 3F:
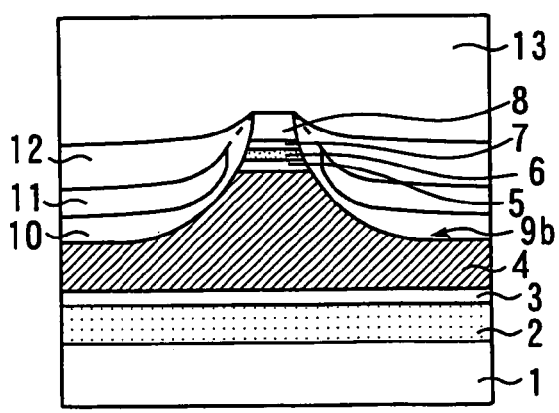

Next, as shown in FIG. 3E, the p-type InP buried layer 10, the n-type InP current blocking layer 11, and the p-type current blocking layer 12 are stacked along the mesas 9a and 9b, in order, by using the MOVPE technique. Moreover, the mask 15a shown in FIG. 3E is removed, and the n-type InP contact layer 13 is formed on the entire surface as shown in FIG. 3F. Furthermore, although it is not shown in the drawing figure, the Mg-doped p-type InP clad layer 4, the p-type InP buried layer 10, the n-type current blocking layer 11, the p-type current blocking layer 12, and the n-type InP contact layer 13 are selectively etched by the photolithography and the etching technology. As a result, the isolation grooves 14a and 14b shown in FIG. 1 are formed.

As described above, a semiconductor laser shown in FIG. 1 can be manufactured.

Second Embodiment

Figure 4:
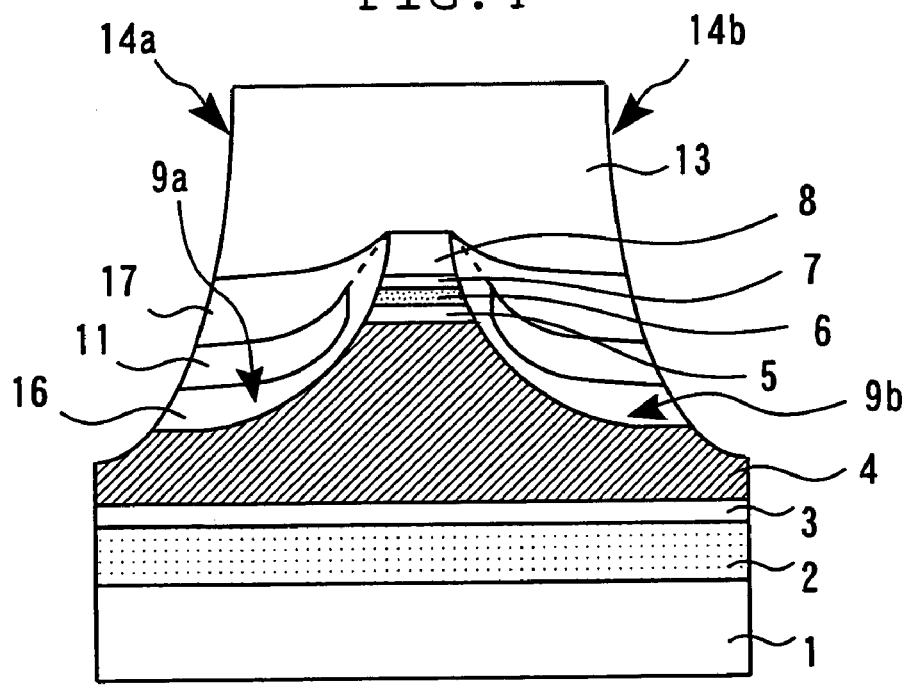
FIG. 4 is a cross-sectional view illustrating a semiconductor laser of the second embodiment.

FIG. 4 is a cross-sectional view illustrating a semiconductor laser according to the second embodiment. Herein, it will be described with particular emphasis on points, which are different from the first embodiment.

A p-type InP buried layer 16, an n-type InP current blocking layer 11, and a p-type current blocking layer 17 are successively stacked in order, so as to come into contact with the Mg-doped p-type InP clad layer 4, the InGaAsP optical confinement layer 5, the InGaAsP MQW active layer 6, the n-type InGaAsP optical confinement layer 7, and the n-type InP clad layer 8 along the mesas 9a and 9b. Mg is doped as a p-type dopant into the p-type InP buried layer 16 and the p-type current blocking layer 17.

The description of the other configuration will be omitted here since it is identical with that of the first embodiment.

In this second embodiment, since Mg is used as a dopant for the p-type InP buried layer 16 and the p-type current blocking layer 17, the diffusion of dopants into the InGaAsP MQW active layer 6 can be suppressed, in contrast to the case where Zn is used. Therefore, it is possible to effectively suppress the deterioration of the device characteristics, so that the semiconductor laser characteristics may be improved.

Moreover, since Mg is used as a dopant for the p-type InP buried layer 16 and p-type current blocking layer 17 in this embodiment, the interdiffusion does not occur between the p-type InP buried layer 16 (or the p-type current blocking layer 17) and the Mg-doped p-type clad layer 4. Thus, in addition to the advantageous effects shown by the first embodiment, the diffusion of dopants into the InGaAsP MQW active layer 6 can be further effectively suppressed. Therefore, it is possible to further effectively suppress the deterioration of the device characteristics, so that the semiconductor laser characteristics may be improved.

Next, a description of another modified example of the above-described second embodiment will be provided hereinbelow.

In the aforementioned second embodiment, Mg was used as a dopant for the p-type InP buried layer 10 and the p-type current blocking layer 12. Mg may also be used as a dopant for either of these layers. Namely, it may be acceptable that Mg be used as a dopant for one layer and Zn be used as dopant for the other layer.

In the case where such a configuration is applied, any interdiffusion might occur between the layer in which Zn is used as a dopant and the Mg-doped p-type InP clad layer 4. However, the amount of Zn diffusing into the InGaAsP MQW active layer 6 can be controlled to become smaller than that in the first embodiment. Therefore, in addition to the effects described with the first embodiment, the diffusion of Zn into the InGaAsP MQW active layer 6 can be more effectively suppressed. Therefore, it is possible to further effectively suppress the deterioration of the device characteristics, so that the semiconductor laser characteristics may be improved.

Third Embodiment

Figure 5:
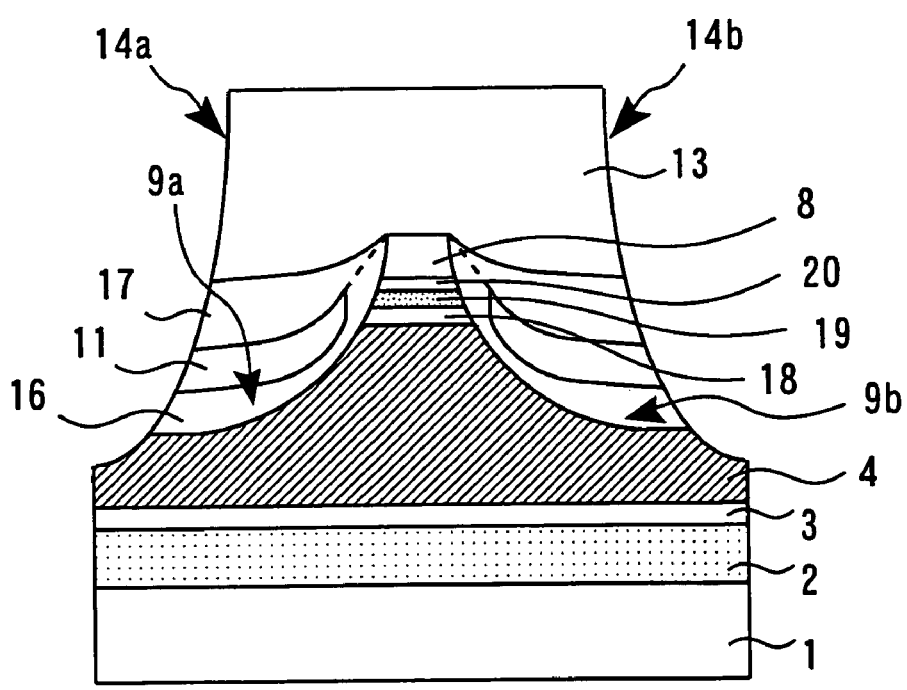
FIG. 5 is a cross-sectional view illustrating a semiconductor laser of the third embodiment.

FIG. 5 is a cross-sectional view illustrating a semiconductor laser according to the third embodiment. Herein, it will be described with particular emphasis on points that are different from the first and second embodiments.

An AlGaInAs optical confinement layer 18, an AlGaInAs MQW active layer 19, an n-type AlGaInAs optical confinement layer 20 are successively stacked in order on the Mg-doped p-type InP clad layer 4. The description of the other configuration is omitted as it is essentially the same as that in the second embodiment.

The shown structure is one in which the InGaAsP contained in each of the InGaAsP optical confinement layer 5, the InGaAsP MQW active layer 6, and the n-type InGaAsP optical confinement layer 7 of the semiconductor laser (FIG. 4) as shown in the second embodiment is replaced by AlGaInAs. AlGaInAs has almost the same range in the band energy gap as InGaAsP and is a material capable of exhibiting the lattice matching to InP. Therefore, the aforementioned replacement is possible.

Moreover, in this case, the difference in the band gap energy of the conductive band at the hetero-interface becomes larger than the case of using InGaAsP. Therefore, an overflow of electrons during energizing may be suppressed. As a result, a semiconductor laser suitable for use in operation at a high temperature can be acquired compared with the first and second embodiments.

Fourth Embodiment

Figure 6:
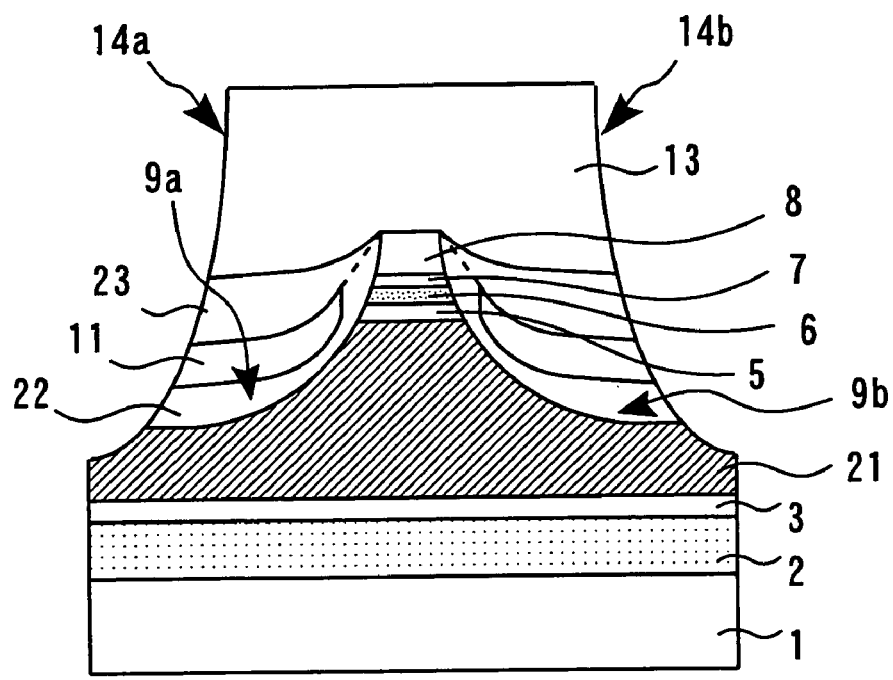
FIG. 6 is a cross-sectional view illustrating a semiconductor laser of the fourth embodiment.

FIG. 6 is a cross-sectional view illustrating a semiconductor laser according to the fourth embodiment. Herein, it will be described with particular emphasis on points that are different from the first to third embodiments.

A Be-doped p-type InP clad layer 21, in which Be (beryllium) is doped into InP, is stacked on the undoped InP buffer layer 3. A p-type InP buried layer 22, an n-type InP current blocking layer 11, and a p-type current blocking layer 23 are successively stacked in order, along the mesas 9a and 9b. Be is doped as a p-type dopant into the p-type InP buried layer 22 and the p-type current blocking layer 23.

The description of the other configuration will be omitted, as it is substantially the same as that in the first embodiment.

In this structure, the Mg-doped p-type InP clad layer 4 of the semiconductor laser shown in the first embodiment (FIG. 1) is replaced by the Be-doped p-type InP clad layer 21. Since the diffusion coefficient of Be in the InP film is smaller than that of Zn, a steep doping profile can be formed in the Be-doped p-type InP clad layer 21 in the vicinity of the InGaAsP MQW active layer 6 in a manner similar to the first embodiment. Moreover, the diffusion of Zn into the above-mentioned active layer can be suppressed. Therefore, similarly to the first embodiment, it is possible to suppress the deterioration of the device characteristics, so that the semiconductor laser characteristics may be improved.

Zn may also be used as a p-type dopant for the p-type InP buried layer 22 and the p-type current blocking layer 23 shown in FIG. 6. In this case, the same effect can be obtained as in the first embodiment. Moreover, the InGaAsP in each of the InGaAsP optical confinement layer 5, the InGaAsP MQW active layer 6, and the n-type InGaAsP optical confinement layer 7 may be replaced by AlGaInAs. In this case, the same effect can be obtained as in the third embodiment.

Moreover, in the above-mentioned first to fourth embodiments, an Mg-doped or a Be-doped p-type InP clad layer is stacked on the undoped InP buffer layer 3. However, it is to be noted that the dopant doped into this p-type InP clad layer may be one other than Mg and Be. For instance, Zn may be used in stead.

In this case, the amount of Zn which diffuses from the Zn-doped p-type InP substrate 1 to the InGaAsP MQW active layer 6 can be suppressed by the presence of the undoped InP buffer layer 3, in contrast to the prior art.

The invention claimed is:

1. A semiconductor laser comprising:
   a p-type InP substrate containing zinc;
   an undoped InP layer on said substrate and electrically connected to said substrate and having a carrier concentration of $3 \times 10^{17}$ cm$^{-3}$ or less;
   a p-type InP cladding layer on said undoped InP layer;
   an active layer on said p-type InP cladding layer and generating a laser beam;
   an n-type InP cladding layer on said active layer and containing n-type dopants; and
   an n-type contact layer on said n-type InP cladding layer and electrically connected to said n-type InP cladding layer.

2. The semiconductor laser according to claim 1, wherein said p-type InP cladding layer contains one of magnesium and beryllium.

3. The semiconductor laser according to claim 1, including an InP layer containing zinc in a lower concentration than in said substrate, between said substrate and said undoped InP layer.

4. The semiconductor laser according to claim 2, including an InP layer containing zinc in a lower concentration than in said substrate, between said substrate and said undoped InP layer.

5. The semiconductor laser according to claim 1, wherein said undoped InP layer has a width greater than width of said p-type InP cladding layer.

6. The semiconductor laser according to claim 2, wherein said undoped InP layer has width greater than width of said p-type InP cladding layer.

7. The semiconductor laser according to claim 3, wherein said undoped InP layer has a width greater than width of said p-type InP cladding layer.

8. The semiconductor laser according to claim 4, wherein said undoped InP layer has a width greater than width of said p-type InP cladding layer.

9. The semiconductor laser according to claim 1, including a p-type semiconductor layer containing one of magnesium and beryllium, in contact with said p-type InP cladding layer.

10. The semiconductor laser according to claim 1, including a p-type semiconductor layer containing one of magnesium and beryllium, and in contact with a side wall of said active layer.

11. The semiconductor laser according to claim 1 further comprising:
    a first semiconductor layer between said active layer and said p-type InP cladding layer; and
    a second semiconductor layer between said active layer and said n-type InP cladding layer, wherein at least one of said active layer, said first semiconductor layer, and said second semiconductor layer comprises an AlGaInAs layer.

* * * * *